United States Patent [19]

Yamazaki

[11] 4,451,838
[45] May 29, 1984

[54] SEMICONDUCTOR PHOTOELECTRIC CONVERSION DEVICE

[76] Inventor: Shunpei Yamazaki, 21-21 Kitakarasuyama 7-chome, Setagaya-ku, Tokyo, Japan

[21] Appl. No.: 220,781

[22] Filed: Dec. 29, 1980

[30] Foreign Application Priority Data

Dec. 30, 1979 [JP] Japan .................. 54-171477

[51] Int. Cl.³ .................. H01L 45/00; H01L 29/161; H01L 27/14; H01L 29/12
[52] U.S. Cl. ......................... 357/2; 357/15; 357/16; 357/30; 357/58; 357/59; 136/255; 136/258
[58] Field of Search ............ 357/30, 30 J, 30 C, 357/30 K, 16, 59, 15, 58, 2, 80; 136/255, 258 AM

[56] References Cited

U.S. PATENT DOCUMENTS 4,133,698 1/1979 Chiang et al. ............ 357/30 X
4,239,554 12/1980 Yamazaki ................. 357/30 X Primary Examiner—Martin H. Edlow
Assistant Examiner—J. Carroll
Attorney, Agent, or Firm—Gerald J. Ferguson, Jr.; Joseph J. Baker

[57] ABSTRACT

A semiconductor photoelectric conversion device in which first and second semiconductor layers are formed on a supporting member and P type and N type semiconductor regions are formed in the second semiconductor layer in a manner to extend into contact with the first semiconductor layer, providing a PIN structure. A semiconductor photoelectric conversion device in which first and second semiconductor layers are formed on a supporting member with an insulating or semi-insulating layer, as a barrier, interposed therebetween, and P type and N type semiconductor regions are formed in the second semiconductor layer in a manner to extend into contact with the insulating or semi-insulating layer. Accordingly, there are formed a first MIS structure by the P type semiconductor region, the insulating or semi-insulating layer and the first semiconductor layer and a second MIS structure by the N type semiconductor region, the insulating or semi-insulating layer and the first semiconductor layer.

10 Claims, 6 Drawing Figures

SEMICONDUCTOR PHOTOELECTRIC CONVERSION DEVICE

BACKGROUND OF THE INVENTION

1. Field of the Invention

The present invention relates to a semiconductor photoelectric conversion device, and more particularly to a semiconductor photoelectric conversion device which is suitable for use in solar batteries.

2. Description of the Prior Art

Heretofore, PN or PIN type and MIS type semiconductor photoelectric conversion devices have been proposed.

In any of these conventional semiconductor photoelectric conversion devices, however, a semiconductor wafer or layer is usually formed to serve as a supporting member of the device, too. Accordingly, the semiconductor wafer or layer must be formed thick and the amount of an expensive material needed therefor is relatively large. Further, since it is necessary to form semiconductor regions of desired conductivity types in the semiconductor wafer or layer used as the supporting member and to provide electrodes on the semiconductor wafer or layer, the manufacture of the prior art devices involves cumbersome manufacturing steps.

Moreover, in the conventional semiconductor photoelectric conversion devices it is common practice that a pair of electrodes for external connections are respectively formed on the opposing surfaces of the semiconductor wafer or layer; and this is inconvenient for the practical use of the devices.

SUMMARY OF THE INVENTION

Accordingly, it is an object of the present invention to provide a novel semiconductor photoelectric conversion device which is free from the abovesaid defects of the prior art.

In accordance with an aspect of the present invention, first and second semiconductor layers are formed on a supporting member and P type and N type semiconductor regions are formed in the second semiconductor layer in a manner to extend into contact with the first semiconductor layer, providing a PIN structure.

In accordance with another aspect of the present invention, first and second semiconductor layers are formed on a supporting member with an insulating or semi-insulating layer, as a barrier, interposed therebetween, and P type and N type semiconductor regions are formed in the second semiconductor layer in a manner to extend into contact with the insulating or semi-insulating layer. Accordingly, there are formed a first MIS structure by the P type semiconductor region, the insulating or semi-insulating layer and the first semiconductor layer and a second MIS structure by the N type semiconductor region, the insulating or semi-insulating layer and the first semiconductor layer.

Since the semiconductor photoelectric conversion device of the present invention has no such an arrangement that a semiconductor layer serves as a supporting member, too, the amount of an expensive material for the semiconductor layer is small. Further, since the device of the present invention can be obtained by forming, on the supporting member, the first and second semiconductor layers with or without the insulating or semi-insulating layer interposed therebetween and forming the P type and N type semiconductor regions in the second semiconductor layer, the manufacture of the device of the present invention is much easier than the prior art devices of this kind. Moreover, the output from the device can be led out through the P and N type semiconductor layers and the P and N type semiconductor regions are disposed only on one of the two opposing sides of the supporting member, allowing ease in the use of the device.

In addition, in the semiconductor photoelectric conversion device of the present invention the second semiconductor layer has a larger energy band gap than the first semiconductor layer and the P type and N type semiconductor regions are formed in the second semiconductor layer. This effectively prevents that holes and electrons which are generated by the incidence of light in the first semiconductor layer are directed to the N type and P type semiconductor regions respectively. In consequence, the device of the present invention has a high photoelectric conversion efficiency.

Other objects, features and advantages of the present invention will becomore more apparent from the following description taken in conjunction with the accompanying drawings.

DESCRIPTION OF THE PREFERRED EMBODIMENTS

Figure 1:
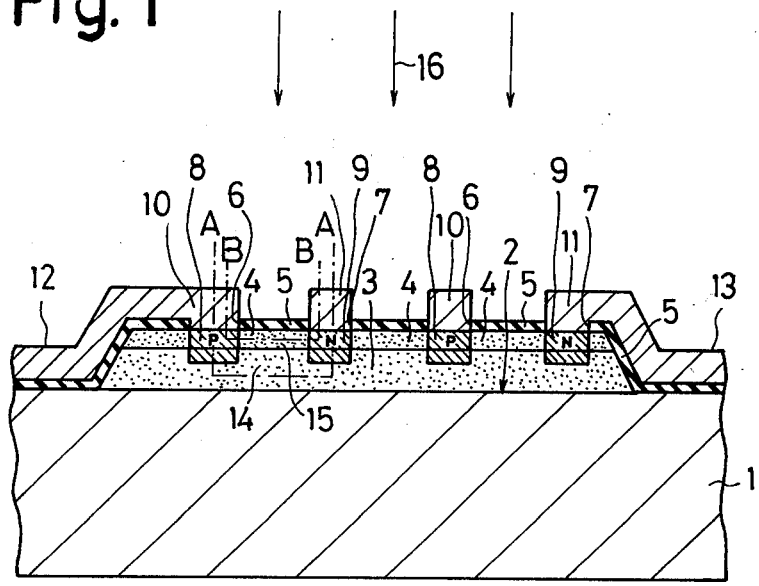
FIG. 1 is a schematic sectional view illustrating a first embodiment of the semiconductor photoelectric conversion device of the present invention which has the PIN structure.

FIG. 1 illustrates a first embodiment of the semiconductor photoelectric conversion device of the present invention of the type having the PIN structure. Reference numeral 1 indicates a supporting member, which has a flat major surface 2 and is made of a ceramic, glass or like insulating material, or a semi-insulating material such as silicon or like semiconductor.

On the major surface 2 of the supporting member 1 is formed a first semiconductor layer 3, which is an intrinsic or substantially intrinsic layer formed without being doped with a P or N type impurity. The first semiconductor layer 3 has a smaller energy band gap than a second semiconductor layer described later, for example, an energy band gap of 1.0 to 1.8 eV. The first semiconductor layer 3 is formed of an amorphous or semi-amorphous semiconductor, in particular, amorphous or semi-amorphous semiconductor, in particular, amorphous or semi-amorphous silicon. The reason for which the first semiconductor layer 3 is formed of amorphous or semi-amorphous silicon is that the amorphous or semi-amorphous silicon has a larger coefficient of light absorption and higher photoconductivity than the single crystal semiconductor such as single crystal silicon.

The first semiconductor layer 3 of the amorphous or semi-amorphous silicon can be formed by the glow discharge method or the plasma CVD (Chemical Vapor Deposit) method which employs a mixture gas composed of a monosilane ($SiH_4$) gas as a silicon material gas and a helium (He) gas as a carrier gas in the ratio of 1 to 20~2000. In the plasma CVD method, the silicon material deposited on the major surface 2 of the supporting member 1 is rendered into amorphous or semi-amorphous silicon by the pressure of the plasma atmosphere at 0.1 to 30 Torr and the surface temperature of the supporting member 1 in the range of room temperature to 500° C. By rendering the mixture gas into a plasma at a distance from the major surface 2 of the supporting member 1 so that the silicon material arrives at the major surface 2 of the supporting member 1 while being crystallized, the silicon material deposited on the major surface 2 of the supporting member 1 becomes semi-amorphous silicon. The semi-amorphous silicon has a crystal structure attendant with a lattice distortion or microcrystal structure and is different structurally from the amorphous or polycrystalline silicon. Further, the semi-amorphous silicon is distinguished from the amorphous or polycrystalline silicon in that the former has a larger light absorption coefficient and higher photoconductivity than the latter, too. In the case where the silicon material arrives at the supporting member 1 before being crystallized, it becomes amorphous. The semiconductor layer 3 of such an amorphous or semi-amorphous silicon obtained by the above-said plasma CVD method has such a construction that dangling bonds of silicon (Si) are substituted with hydrogen (H). Therefore, the semiconductor layer 3 has a small number of recombination centers and consequently it has a high degree of carrier mobility.

The first semiconductor layer 3 of polycrystalline silicon can be provided by the pressure-reduction, vapor growth method, using a mixture gas composed of a $SiH_4$, $SiH_2Cl_2$, $SiCl_4$, $SiF_4$ or like gas as the silicon material gas and the helium (He) gas as the carrier gas and maintaining the surface temperature of the supporting member 1 at 700° to 1100° C.

The first semiconductor layer 3 may also be made a layer doped with nitrogen (N), oxygen (O), carbon (C) or hydrogen (H). This can be achieved by adding an $NH_3$, $N_2O$, $CH_4$ or $H_2$ gas to the mixture gas in the plasma CVD method. In this case, however, the $H_2$ gas need not always be used for the formation of the layer 3 doped with the hydrogen, for such a layer can be formed by the abovesaid plasma CVD method without adding the $H_2$ gas.

The first semiconductor layer 3, which is formed by amorphous or semi-amorphous silicon doped with 0.1 to 10 mol% of nitrogen (N), oxygen (O), carbon (C) or hydrogen (H), has an energy band gap of 1.2 to 1.8 eV. The semiconductor layer 3 doped with the nitrogen is an excellent thermal insulation.

On the first semiconductor layer 3 is formed a second semiconductor layer 4, which is also an intrinsic or substantially intrinsic layer formed without being doped with a P or N type impurity. The second semiconductor layer 4 has a larger energy band gap than the first semiconductor layer 3, for example, 1.5 to 6.0 eV. The thickness of the second semiconductor layer 4 can be made as small as, for example, $\frac{1}{3}$ to 1/20 that of the first semiconductor layer 3; however, it is preferred that the second semiconductor layer 4 has a thickness $\frac{1}{4}$ the wavelength of light so as to perform the function of an anti-reflection film.

The second semiconductor layer 4 is formed of amorphous or semi-amorphous semiconductor, in particular, amorphous or semi-amorphous silicon nitride, silicon oxide or silicon carbide. Further, the second semiconductor layer 4 may also be doped with hydrogen (H).

The second semiconductor layer 4 of the amorphous or semi-amorphous silicon nitride can be made of a layer having a composition of $Si_3N_{4-x}$ ($0.5<X<4$) by the glow discharge method or the plasma CVD method, using a mixture gas containing a monosilane ($SiH_4$) gas as a silicon material gas, an $NH_3$ gas as a nitrogen material gas, and a helium (He) gas as a carrier gas. The second semiconductor layer 4 having thus obtained has an energy band gap of 1.1 to 4.5 eV. The second semiconductor layer 4 of the amorphous or semi-amorphous silicon oxide can be obtained as a layer having a composition of $SiO_{2-y}$ ($0.5 \leq y < 2$) by the glow discharge method or the plasma CVD method, using a mixture gas containing an $SiH_4$ gas as a silicon material gas, an $N_2O$ gas as an oxygen material gas and a helium (He) gas as a carrier gas. The second semiconductor layer 4 thus obtained has an energy band gap of 1.1 to 6.0 eV. The second semiconductor layer 4 of the amorphous or semi-amorphous silicon carbide can be formed as a layer having a composition of $SiC_z$ ($0.5<z<1$) by the glow discharge method or the plasma CVD method, using a mixture gas containing an $SiH_4$ gas as a silicon material gas, a $CH_4$ gas as a carbon material gas and a helium (He) gas as a carrier gas. The second semiconductor layer 4 thus obtained has an energy band gap of 1.1 to 3.0 eV. In the case of using the amorphous or semi-amorphous silicon nitride, oxide or carbide doped with hydrogen (H), the second semiconductor layer 4 can be formed by the aforesaid plasma CVD method without using any particular gas but it is also possible to include a $H_2$ gas in the mixture gas. The amorphous or semi-amorphous silicon nitride, oxide or carbide doped with the hydrogen provides a larger energy band gap than in the case of the amorphous or semi-amorphous nitride, oxide or carbide which is not doped with hydrogen.

On the supporting member 1 is formed an insulating protective layer 5 which extends to cover the side surface of the first semiconductor layer 3 and the side surface and the top surface of the second semiconductor layer 4. The insulating protective layer 5 has a relatively small thickness of, for example, 500 to 200 Å and is light transparent. While the insulating protective layer 5 can be made a silicon oxide layer by means of the vapor growth method, it may preferably be made a silicon nitride layer by the vapor growth method using a $SiH_4$ and an $NH_3$ gas. The insulating protective layer 5 has formed therein windows 6 and 7 in a comb- or grid-like pattern in a manner to bear an interdigital relationship to each other. It is preferred that the windows 6 and 7 each have a small width of, for example, 2 to 20 μm, particularly 5 to 7 μm. The windows 6 and 7 bear the interdigital relationship to each other as mentioned above and the distance between adjacent fingers of the windows 6 and 7 may preferably be selected to be shorter than the diffusion length of the carriers (holes and electrons) which are yielded by the incidence of light in the semiconductor layers 3 and 4; namely, the figures of the both windows are spaced apart, for example, a distance $\frac{1}{2}$ to $\frac{1}{4}$ the diffusion length.

In the second semiconductor layer 4 there are formed at the positions corresponding to the windows 6 and 7 of the insulating protective layer 5, P type and N type semiconductor regions 8 and 9, respectively, on the opposite side from the first semiconductor layer 3. Accordingly, in the second semiconductor layer 4 are formed the P type and N type semiconductor regions 8 and 9 which are respectively open to the windows 6 and 7 and have the same comb- or grid-like patterns as the windows 6 and 7.

The P type and N type semiconductor regions 8 and 9 extends into the first semiconductor layer 3 to make contact therewith. The P type semiconductor region 8 can be made a region having an impurity concentration as high as $10^{18}$ atoms/cm$^3$, by diffusing or doping a P type impurity such, for instance, as boron (B) towards the first semiconductor layer 3 from the side of the insulating protective layer 5 through the window 6, using the insulating protective layer 5 as a mask and covering the windows 7 with, for example, a silicon oxide layer. The N type semiconductor region 9 can similarly be obtained as a region having a high impurity concentration of $10^{18}$ atoms/cm$^3$, by diffusing or doping phosphorus (P) or like N type impurity towards the first semiconductor layer 3 from the side of the insulating protective layer 5 through the window 7, using the insulating protective layer 5 as a mask and covering the window 6 with, for example, a silicon oxide layer.

The P type and N type semiconductor regions 8 and 9 respectively make ohmic contact with first and second electrodes 10 and 11 through the windows 6 and 7 of the insulating protective layer 5. The first and second electrodes 10 and 11 are formed over the insulating protective layer 5 to extend into direct contact with the supporting member 1, forming terminals 12 and 13 for external connections. The electrodes 10 and 11 can be formed 0.5 to 2μ thick by the evaporation of, for example, aluminum.

Figure 2A:
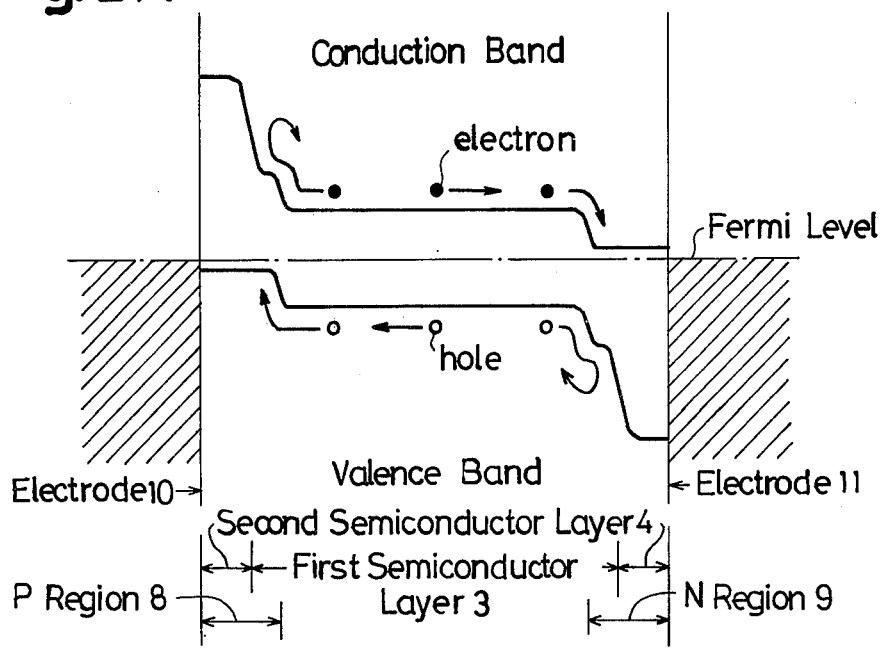
FIGS. 2A and 2B are schematic diagrams showing the energy band structure of the semiconductor photoelectric conversion device of FIG. 1, as viewed on the lines A-A and B-B in FIG. 1.
Figure 2B:
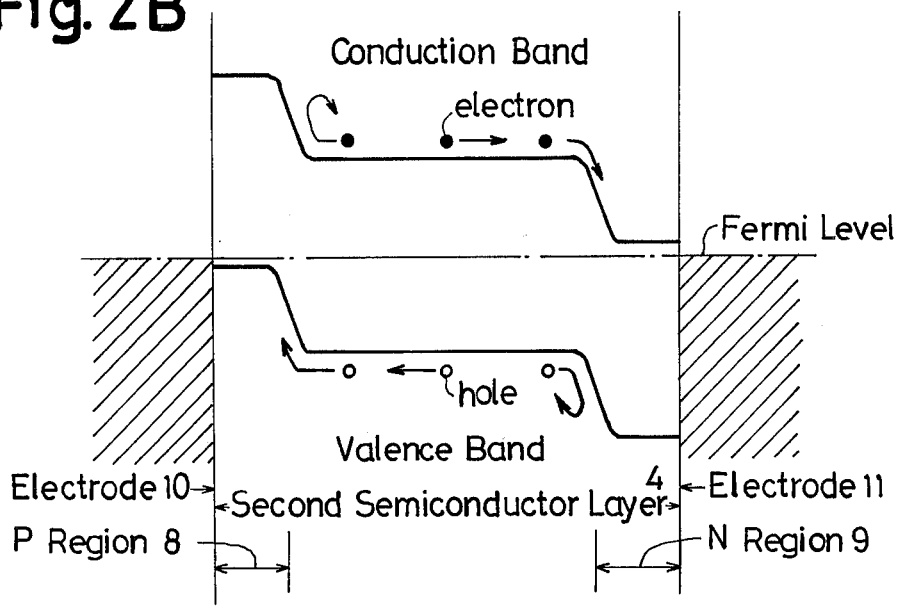

The above is the construction of the first embodiment of the semiconductor photoelectric conversion device of the present invention. With such an arrangement, there are provided a first PIN structure which is constituted by the P type and N type semiconductor regions 8 and 9 and a region formed therebetween in the first semiconductor layer 3 and has the energy band structure shown in FIG. 2A and a second PIN structure which is constituted by the P type and N type semiconductor regions 8 and 9 and a region formed therebetween in the second semiconductor layer 4 and has the energy band shown in FIG. 2B. The pair of electrodes of the semiconductor photoelectric conversion device having such first and second PIN structures are the electrodes 10 and 11 which make contact with the P type and N type semiconductor regions 8 and 9, respectively.

Accordingly, in the semiconductor photoelectric conversion device of FIG. 1, when light is incident to the semiconductor layers 3 and 4 from the side of the insulating protective layer 5, the conventional PIN type semiconductor photoelectric conversion function is performed for each of the first and second PIN structures. In concrete terms, when the light is incident to the semiconductor layers 3 and 4, holes and electrons are generated in the regions 14 and 15 between the P type and N type semiconductor regions 8 and 9 of the layer 3 and 4, the holes are directed to the P type semiconductor region 8 and the electrons are directed to the N type semiconductor region 9, providing across the electrodes 10 and 11 an electric output of a value corresponding to the intensity of the incident light.

Since the I layer of the second PIN structure, that is, the region 15 defined between the P type and N type semiconductor regions 8 and 9 of the second semiconductor layer 4 has a larger energy band gap than the I layer of the first PIN structure, that is, the region 14 defined between the P type and N type semiconductor regions 8 and 9 of the first semiconductor layer 3, however, there is set up between the regions 14 and 15 an acceleration electric field by which the holes and electrons yielded in the region 15 are accelerated towards the region 14. Further, the region 14 is thicker than the region 15. Consequently, the photoelectric conversion function by the first PIN structure is larger than that by the second PIN structure. In addition, in the first PIN structure of the larger photoelectric conversion function, those portions of the P type and N type semiconductor regions 8 and 9 on the side of the electrodes 10 and 11 are formed in the second semiconductor layer 4 of the larger energy band gap, so that these portions have a larger energy band gap than the region 14. Accordingly, even if the electrons and holes created in the region 14 tend to move towards the P type and N type semiconductor regions 8 and 9, they are repelled to be directed to the N type and P type semiconductor regions 9 and 8.

Therefore, the semiconductor photoelectric conversion device of the present invention exhibits a high photoelectric conversion efficiency. By the way, according to my experiments, a photoelectric conversion efficiency of 12 to 16% was obtained.

Moreover, the first embodiment of the present invention described above employs the supporting member 1 and has no such arrangement that the semiconductor layer is used as the supporting member, too, and hence it does not require a large amount of the costly material for the semiconductor layer. Accordingly, the device of the present invention can be produced at low cost.

In addition, the device of the present invention is easy to manufacture since it can be obtained by forming the first and second semiconductor layers 3 and 4 on the supporting member 1, providing the P type and N type semiconductor regions 8 and 9 in the second semiconductor layer 4 and contacting the electrodes 10 and 11 with the regions 8 and 9.

Further, the P type and N type semiconductor regions 8 and 9 are formed in the second semiconductor layer 4 formed on the one surface 2 of the supporting member 1 and the output can be led out through the regions 8 and 9; accordingly, the device is convenient to use.

Figure 3:
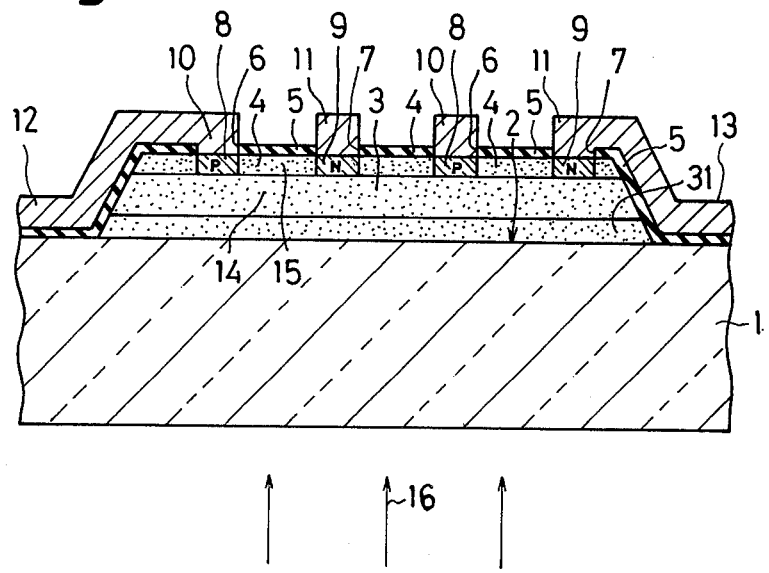
FIGS. 3 and 4 are schematic sectional views respectively illustrating second and third embodiment of the semiconductor photoelectric conversion device of the present invention which have the PIN structure.

Next, a description will be given, with reference to FIG. 3, of a second embodiment of the semiconductor photoelectric conversion device of the present invention. In FIG. 3, the parts corresponding to those in FIG. 1 are identified by the same reference numerals and no detailed description will be repeated. The second embodiment is identical in construction except in the following points. The supporting member 1 is light transparent and is formed of, for example, glass. Between the major surface 2 of the supporting member 1 and the first semiconductor layer 3 is interposed a third semiconductor layer 31 which has a larger energy band gap than the first semiconductor layer 3. The third semiconductor layer 31, though not described in detail, can be formed to be of the same construction as the second semiconductor layer 4 by the same method.

The above is the construction of the second embodiment of the present invention, which has the same construction as the first embodiment except in the abovesaid points. Accordingly, the second embodiment such an arrangement that there are constituted on the third semiconductor layer 31 a first PIN structure by the P type and N type semiconductor regions 8 and 9 and the region 14 defined between in the first semiconductor layer 3, and a second PIN structure by the regions 8 and 9 and the region 15 defined therebetween in the second semicondcutor layer 4. And the supporting member 1 is light transparent.

With the arrangement of the second embodiment of the present invention described above in conjunction with FIG. 3, when light 16 is incident to the semiconductor layers 31, 3 and 4 from the side of the supporting member 1, there can be obtained the same photoelectric conversion function. Since the third semiconductor layer 31 is provided, however, holes and electrons are generated by the incidence of the light 16 in the layer 31, too. The semiconductor layer 31 has a larger energy band gap than the first semiconductor layer 3, so that there is established between the layers 31 and 3 an electric field by which the holes and electrons developed in the layer 31 are accelerated towards the layer 3. In consequence, the photoelectric conversion function which is larger than that obtainable with the first embodiment of FIG. 1 can be obtained.

Figure 4:
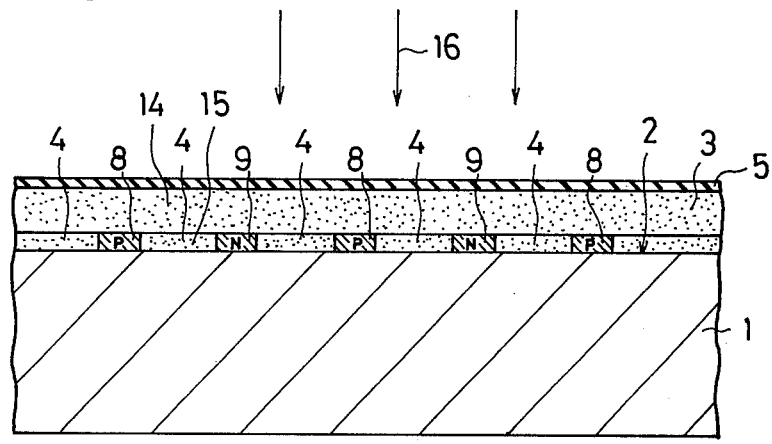

Next, a description will be given, with reference to FIG. 4, of a third embodiment of the semiconductor photoelectric conversion device of the present invention In FIG. 4, the parts corresponding to those in FIG. 1 are identified by the same reference numerals and no detailed description will be repeated. The third embodiment is identical in construction with the first embodiment of FIG. 1 except in that in the latter the first semiconductor layer 3 lies on the side of the supporting member 1 with respect to the semiconductor layer 4, whereas in the former the second semiconductor layer 4 lies on the side of the supporting member 1 with respect to the first semiconductor layer 3. And the insulating protective layer 5 is formed on the semiconductor layer 3 accordingly but in this case, the insulating protective layer 5 has no such windows 6 and 7 as mentioned previously. The insulating protective layer 5 and the semiconductor layer 3 are removed at one end to expose the P type and N type semiconductor regions 8 and 9 and the electrodes 10 and 11 is formed on the major surface 2 of the supporting member 1 to extend on the exposed regions.

The above is the third embodiment of the present invention. This embodiment has the same construction as the embodiment of FIG. 1 except in the abovesaid points and hence it has the same operational effect and advantages as the first embodiment, though not described in detail.

Figure 5:
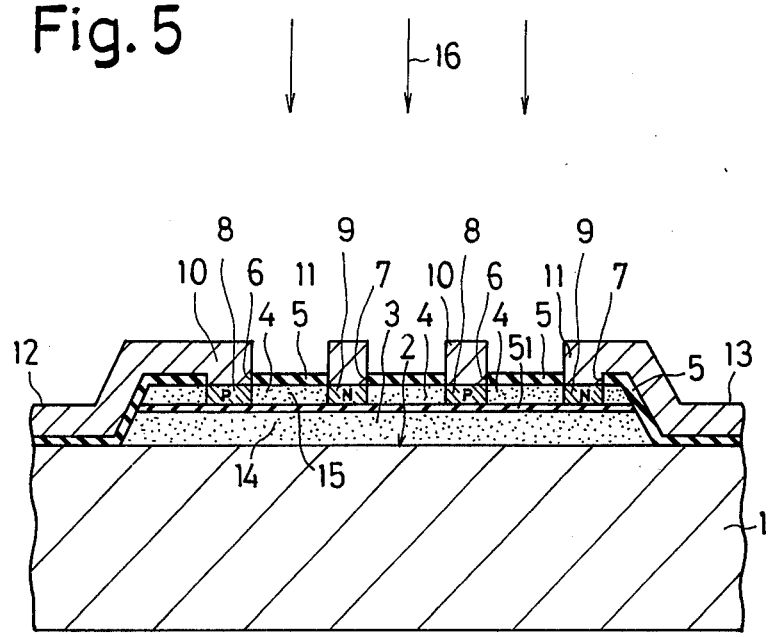
FIG. 5 is a schematic sectional view illustrating an embodiment of the semiconductor photoelectric conversion device of the present invention which has the MIS structure.

Next, a description will be given, with reference to FIG. 5, of an embodiment of the semiconductor photoelectric conversion device of the present invention which has a MIS structure. In FIG. 5, the parts corresponding to those in FIG. 1 are identified by the same reference numerals and no detailed description will be repeated. This embodiment is identical in construction with the embodiment of FIG. 1 except in that an insulating or semi-insulating layer 51 is interposed between the first and second semiconductor layers 3 and 4 and that the P type and N type semiconductor regions 8 and 9 extend to make contact with the insulating or semi-insulating layer 51. In this case, the insulating or semi-insulating layer 51 is light transparent and has a sufficiently small thickness to permit the passage therethrough of a tunnel current, for example, 2 to 50 Å, preferably, 2 to 30 Å. The insulating or semi-insulating layer 51 can be made a silicon nitride layer. The silicon nitride layer can be formed by the plasma CVD method, using a mixture gas containing a silicon material gas, for example, a $SiH_4$ gas, a nitrogen material gas, for example, an $NH_3$ gas and a helium (He) gas as a carrier gas, holding the pressure of the plasma atmosphere at 0.001 to 0.1 Torr and retaining the surface of the first semiconductor layer 3 in a temperature range of room temperature to 500° C.

The above is the embodiment of the semiconductor photoelectric conversion device of the present invention which is of the type having the MIS structure. This embodiment has a first MIS structure which is constituted by the P type semiconductor region 8, the insulating or semi-insulating layer 51 and the first semiconductor layer 3, a second MIS structure which is constituted by the N type semiconductor region 9, the insulating or semi-insulating layer 51 and the first semiconductor layer 3 and a PIN structure which is constituted by the P type and N type semiconductor regions 8 and 9 and the region 15 defined therebetween in the second semiconductor layer 4. With the arrangement shown in FIG. 5, however, when light is incident to the region 15 of the layer 4 through the insulating protective layer 5 and to the region 14 of the semiconductor layer 3 through the insulating protective layer 5, the region 15 and the insulating or semi-insulating layer 51, holes and electrons are produced in the regions 15 and 14 and the holes and electrons generated in the region 15 reach directly the P type and N type semiconductor regions 8 and 9, respectively and the holes and electrons yielded in the region 14 reach the P type and the N type semiconductor regions respectively through the insulating or semi-insulating layer 51, thereby producing the photoelectric conversion function. And the output can be led out through the electrodes 10 and 11.

Accordingly, the embodiment of FIG. 5 has the first and second MIS structure and the PIN structure but obtains the same operational effect as the first embodiment of FIG. 1. Further, this embodiment is identical in construction with the embodiment of FIG. 1 except in the abovementioned points and hence has the same excellent features as the latter.

The foregoing description should be construed as merely illustrative of the present invention and should not be construed in a limiting sense. For example, in the arrangements described previously in respect of FIGS. 1, 4 and 5, it is also possible to make the supporting member 1 light transparent so that light may be incident to the semiconductor layers 3 and 4 from the side of the supporting member 1. In the arrangement of FIG. 4, it is also possible to interpose between the insulating protective layer 5 and the first semiconductor layer 3 the third semiconductor layer 31 mentioned previously with regard to FIG. 3. Also it is possible, in the embodiment of FIG. 5, to interpose the third semiconductor layer 31 between the supporting member 1 and the first semiconductor layer 3 as in the case of FIG. 3. Further, in the embodiment of FIG. 4, too, the insulating or semi-insulating layer 51 may be interposed between the first and second semiconductor layers 3 and 4 to provide the MIS structure. The first semiconductor layer 3 need not always be formed of silicon but may also be made of the II–VI group compound semiconductors such as CdS, Cu$_2$O, CdTe and so forth and III–V group compound semiconductors such as GaAlAs, GaP, GaAlP, BP and so forth. Further, the second or third semiconductor layer 3 or 4 may be formed of the above-said II–VI group compound semiconductors or nitride, oxide or carbide. In addition, it is also possible to add, for example, 0.1 to 30 mol% of a transition metal such as W, Mg, Ti or the like to the P type and N type regions 8 and 9 to enhance their electric conductivity or degenerate them in terms of the quantum theory. Moreover, in the foregoing arrangement the P and N type conductivity types can be exchanged.

It will be apparent that many modifications and variations may be effected without departing from the scope of the novel concepts of this invention.

What is claimed is:

1. A semiconductor photoelectric conversion device comprising:
    a supporting member;
    a first semiconductor layer formed on the supporting member;
    a second semiconductor layer formed on the first semiconductor layer;
    P type and N type semiconductor regions formed in the second semiconductor layer; and
    first and second electrodes formed over the second semiconductor layer and contacting P type and N type semiconductor regions;
    wherein the first and second semiconductor layers are formed of amorphous or semi-amorphous semiconductor and are intrinsic;
    wherein the second semiconductor layer has a larger energy gap than the first semiconductor layer, and
    wherein the P type and N type semiconductor regions are spaced apart and are in contact with the first semiconductor layer.

2. A semiconductor photoelectric conversion device according to claim 1, wherein the amorphous or semi-amorphous semiconductor of the first semiconductor layer is amorphous or semi-amorphous silicon, and wherein the amorphous or semi-amorphous semiconductor of the second semiconductor layer is an amorphous or semi-amorphous silicon nitride, oxide or carbide.

3. A semiconductor photoelectric conversion device according to claim 2, wherein the second semiconductor layer is doped with hydrogen.

4. A semiconductor photoelectric conversion device comprising:
    a supporting member;
    a first semiconductor layer formed over the supporting member;
    a second semiconductor layer formed on the first semiconductor layer;
    a third semiconductor layer formed between the supporting member and the first semiconductor layer;
    P type and N type semiconductor regions formed in the second semiconductor layer; and
    first and second electrodes contacting P type and N type semiconductor regions;
    wherein the first, second and third semiconductor layers are formed of amorphous or semi-amorphous semiconductor and are intrinsic;
    wherein the third semiconductor layer has a larger energy gap than the first semiconductor layer;
    wherein the P type and N type semiconductor regions are spaced apart and are in contact with the first semiconductor layer; and
    wherein the supporting member is light transparent.

5. A semiconductor photoelectric conversion device according to claim 4, wherein the amorphous or semi-amorphous semiconductor of the first semiconductor layer is amorphous or semi-amorphous silicon, and wherein the amorphous or semi-amorphous semiconductor of the second and third semiconductor layers is an amorphous or semi-amorphous silicon nitride, oxide or carbide.

6. A semiconductor photoelectric conversion device according to claim 5, wherein the second and third semiconductor layers are doped with hydrogen.

7. A semiconductor photoelectric conversion device comprising:
    a supporting member;
    a first semiconductor layer formed on the supporting member;
    a second semiconductor layer formed on the first semiconductor layer;
    P type and N type semiconductor regions formed in the first semiconductor layer; and
    first and second electrodes contacting P type and N type semiconductor regions;
    wherein the first and second semiconductor layers are formed of amorphous or semi-amorphous semiconductor and are intrinsic;
    wherein the first semiconductor layer has a larger energy gap than the second semiconductor layer, and
    wherein the P type and N type semiconductor regions are spaced apart and are in contact with the second semiconductor layer.

8. A semiconductor photoelectric conversion device comprising:
    a supporting member;
    a first semiconductor layer formed over the supporting member;
    a second semiconductor layer formed on the first semiconductor layer;
    an insulating or semi-insulating layer formed, as a barrier, between the first and second semiconductor layers;
    P type and N type semiconductor regions formed in the second semiconductor layer; and
    first and second electrodes contacting P type and N type semiconductor regions;
    wherein the first and second semiconductor layers are formed of amorphous or semi-amorphous semiconductor and are intrinsic;
    wherein the second semiconductor layer has a larger energy gap than the first semiconductor layer; and
    wherein the P type and N type semiconductor regions are spaced apart and are in contact with the insulating or semi-insulating layer.

9. A semiconductor photoelectric conversion device according to claim 8, wherein the amorphous or semi-amorphous semiconductor of the first semiconductor layer is amorphous or semi-amorphous silicon, and wherein the amorphous or semi-amorphous semiconductor of the second semiconductor layer is an amorphous or semi-amorphous silicon nitride, oxide or carbide.

10. A semiconductor photoelectric conversion device according to claim 9, wherein the second semiconductor layer is doped with hydrogen.

* * * * *